United States Patent
Erickson et al.

(10) Patent No.: US 6,914,951 B2
(45) Date of Patent: Jul. 5, 2005

(54) METHOD AND APPARATUS FOR A DIGITAL LOGIC INPUT SIGNAL NOISE FILTER

(75) Inventors: Michael John Erickson, Loveland, CO (US); Bradley D. Winick, Fort Collins, CO (US); David R. Maciorowski, Parker, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 862 days.

(21) Appl. No.: 09/912,191

(22) Filed: Jul. 24, 2001

(65) Prior Publication Data

US 2003/0053570 A1 Mar. 20, 2003

(51) Int. Cl.[7] .............................................. H04B 1/10
(52) U.S. Cl. .......................... 375/350; 375/360; 327/34
(58) Field of Search ......................... 375/350, 360–362, 375/285, 315, 346, 377; 327/24, 31, 33, 34–37, 309–311; 455/222–223, 305

(56) References Cited

U.S. PATENT DOCUMENTS

| | | | | |
|---|---|---|---|---|
| 4,431,930 A | * | 2/1984 | Monticelli | 327/205 |
| 4,775,840 A | * | 10/1988 | Ohmori et al. | 327/34 |
| 5,001,374 A | * | 3/1991 | Chang | 327/552 |
| 5,199,048 A | * | 3/1993 | Wakabayashi | 375/351 |
| 5,386,159 A | * | 1/1995 | Dupre | 327/310 |
| 5,572,549 A | * | 11/1996 | Shimomura et al. | 375/285 |
| 6,337,649 B1 | * | 1/2002 | Becker et al. | 341/155 |

OTHER PUBLICATIONS

Sun, X. Z., Venetsanopoulos, Anastasios N., "Adaptive Schemes for Noise Filtering and Edge Detection by Use of Local Statistics", Jan. 1988, IEEE Transactions on Circuits and Systems, vol. 35, No. 1.*

Lee, Kyu–Cheol, Sohn Kwang–Hoon, Huh, Young, "An Efficient Approach to Impulsive Noise Filtering", Oct. 12–16, 1998, Signal Processing Proceedings 1998, ICSP '98. 1998 Fourth International Conference on, vol. 2, pp. 1021–1024.*

Wu, Chung–Bin, Liu Bin–Da, Yang, Jar–Ferr, Hsia, Shih–Chang, "Algorithm of Digital Impulse Noise Cancellation", Circuits and Systems, Nov. 24–27, 1998. IEEE APCCAS 1998. The 1998 IEEE Asia–Pacific Conference on, pp. 319–322.*

* cited by examiner

*Primary Examiner*—Bocure Tesfaldet
*Assistant Examiner*—Khanh Tran

(57) ABSTRACT

Logic apparatus filters noise signals on a signal line to a digital circuit. An edge detector determines one or more edges of the noise signals relative to a fast clock. Signals indicative of the edges asynchronously reset a timer; the timer clocks the latch of the signal line when the signal line is stable, and without noise signals detected by the edge detector, for a period defined by a slow clock. The slow clock is slower than the fast clock by several orders of magnitude. The edge detector may be constructed by one flip-flop and an XOR gate. A second flip flop couples to the signal line and the output of the timer to pass through the latched value of the signal line to the digital circuit when clocked by the timer.

19 Claims, 3 Drawing Sheets

METHOD AND APPARATUS FOR A DIGITAL LOGIC INPUT SIGNAL NOISE FILTER

A portion of the disclosure of this patent application contains material which is subject to copyright protection. The copyright owner has no objection to the facsimile reproduction by anyone of the patent document or the patent disclosure, as it appears in the Patent and Trademark patent file or records, but otherwise reserves all copyright rights whatsoever.

BACKGROUND OF THE INVENTION

Digital circuitry is commonplace in today's electronic systems, such as computers, printers, servers, and telecommunications hardware. The complexity of such systems often involves lengthy internal signal lines spanning up to twenty inches or more through printed circuit board tracks or traces and back-planes. One problem with these signal lines is that they generate noise for the associated digital circuitry; they also often act as antennae to couple unwanted noise signals to the digital circuitry. In one example, certain electronic systems incorporate a voltage signal coupled to a field programmable gate array (FPGA) along a voltage signal line, to indicate power quality; however noise coupled to the signal line may generate a false reading in the FPGA, resulting in unwanted shut-off or other malfunction.

More generally, noise coupled to digital signal lines can create false triggers and metastability problems when a noise spike is latched into a digital circuit. This may happen, for example, when the noise spike coincides with a clock edge in the digital circuit.

Noise in digital circuits may also cause particular problems for signals with slow rise or fall times: when a slowly changing signal is transitioning on a signal line to a digital circuit, noise on that line may result in false detections, by the digital circuit, of multiple edges.

The prior art incorporates several techniques to filter noises on signal lines to digital circuits. A particularly popular approach is to incorporate an analog filter near to the input of the digital circuitry. For example a low pass filter may be implemented at the input to remove high frequency spikes on the signal line. Incorporating low pass filter however also slows down the desired signal edges, which may induce other problems. Analog filters have other problems in that they may utilize resistors and capacitors that are relatively expensive to incorporate on each signal line. An approach utilizing a series of analog filters also typically requires lists and tracking to facilitate configuration management and best practices design engineering, adding additional costs. Stray inductances and capacitance may also induce unwanted resonances within the underlying digital circuit, creating further difficulties.

The prior art has also attempted to filter noises on signal lines to digital circuits by incorporating hysterisis, as with a Schmidt trigger; however, Schmidt trigger devices are susceptible to large voltage spikes, creating unpredictable operation.

The prior art has also utilized the microprocessor to sample the signal line to digital circuitry. The microprocessor may for example pass along a signal line value to the digital circuitry when sampling of the signal line provides a statistically stable line value. Sophisticated versions of this technique may include sampling the signal line at varying frequencies in an attempt to de-couple the sampling from any signal line harmonics. However, systems that incorporate such microprocessors incorporate an expensive and complicated overhead, particularly when the processor is dedicated for this purpose. Furthermore, similar to the low-pass filter problems described above, the delay caused by sampling of the signal line acts as a lag to signal acquisition to the underlying digital circuit. In addition, the electrical designer of the system must meaningfully manage the many processor cycles used in sampling the signal line.

One other popular approach in the prior art to filter noise on digital signal lines, input to an accompanying digital circuit, is the use of cascaded D flip-flops. In this approach, every input clock cycle is clocked into the first D flip-flop, and then progresses down the chain of D flip-flops. After a sufficient number of clock cycles—typically corresponding to the length of the D flip-flop chain—the input is sampled and fed to the digital circuit if all the outputs of the D flip-flops are the same. A significant problem with this approach is that a large number of flip-flops is often required, adding design complexity and cost, and decreasing board real estate available for core system components.

It is, accordingly, one object of the invention is to provide methods and apparatus for filtering signals on a signal line so that noise pulses are not latched into the accompanying digital circuit, and without the afore-mentioned problems. Another object of the invention is to provide a digital filter without the use of analog components or microprocessors. Yet another object of the invention is to provide a method for ensuring a single transition to digital circuitry by filtering unwanted noise components on a signal line to the circuitry. Other objects of the invention are apparent within the description that follows.

SUMMARY OF THE INVENTION

In one aspect, the invention provides a method of separating noise from a signal on a signal line to a digital circuit. The method includes the steps of: determining one or more edges of the noise relative to a fast clock; resetting a timer according to the edges; clocking output from the timer relative to a slow clock, the slow clock being slower than the fast clock; and communicating a first value from the signal line to the digital circuit after a period, defined by the slow clock, within which the timer has not reset. Preferably, the step of resetting the timer occurs asynchronously with timing of the edges of the noise.

In a preferred aspect, the fast clock has a rate of about 8 MHz and the slow clock has a periodic rate of about four milliseconds. The ratio between the fast clock frequency and the slow clock frequency is typically greater than at least 1000 and is preferably greater than about 10,000.

In another aspect, the method utilizes an edge detector in determining the edges. The edge detector may include a flip-flop coupled to the signal line. The flip-flop may be a D flip-flop with a D input that couples to the signal line. An output of the D flip flop may be used to communicate an intermediate "B" signal value to other components of the edge detector. The B signal value is preferably latched to an "A" signal value corresponding to a value of the signal line at a rising edge of the fast clock. In a preferred aspect, signal values A and B are compared such as with an XOR gate; the output of the XOR gate may be fed to the timer as an "E" signal value.

In one aspect, the step of communicating includes the step of utilizing a second flip-flop, e.g., a D flip-flop. The second flip-flop may include the step of clocking the second flip-flop from an output of the timer. The signal line feeds the D input to the second flip-flop; and the timer feeds the clock input to the second flip-flop. The output of the second flip-flop is input to the digital circuit.

The invention also provides, in another aspect, logic apparatus for filtering noise signals on a signal line to a digital circuit. An edge detector detects edges of the noise signals and relative to a fast clock. A timer clocks a latch to a value of the signal line and relative to a slow clock. The slow clock is slower than the fast clock. The timer is asynchronously reset by one or more signals from the edge detector and corresponding to the edges. The latch occurs after a time period defined by the slow clock within which the timer has not reset.

In one aspect, the logic apparatus includes a first flip-flop, e.g., a D flip-flop, connected to the timer and the signal line. The first flip flop latches the value of the signal line when clocked by the timer.

The edge detector may include a second flip-flop, e.g., a D flip-flop, and a digital comparator. The signal line is coupled to an input to the second flip flop; the second flip flop is clocked by the fast clock to produce a B signal value at an output of the second flip flop. The B signal value corresponds to an A value of the signal line at a rising edge of the fast clock. A digital comparator, e.g., an XOR gate, compares the A signal value of the signal line to the B signal for input to the timer.

The invention is next described further in connection with preferred embodiments, and it will become apparent that various additions, subtractions, and modifications can be made by those skilled in the art without departing from the scope of the invention.

BRIEF DESCRIPTION OF THE DRAWINGS

A more complete understanding of the invention may be obtained by reference to the drawings, in which.

DETAILED DESCRIPTION OF THE PREFERRED EMBODIMENTS

Figure 1:
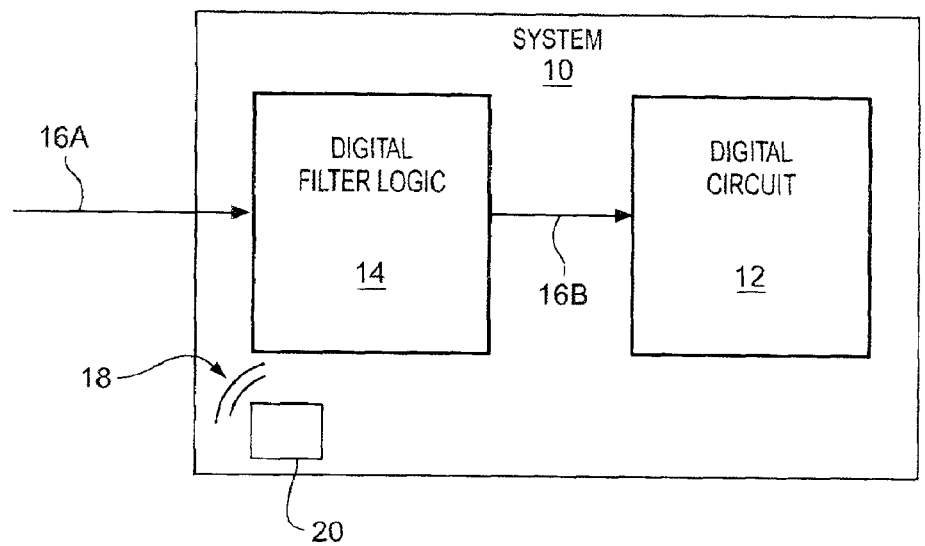
FIG. 1 shows a system incorporating a digital noise filter, in accord with the invention.

FIG. 1 shows a system 10 incorporating a digital circuit 12 and associated digital logic 14, in accord with the invention. In operation, digital circuit 12 may acquire signals from a variety of sources, such as from a signal line 16A. Signal line 16A may derive from points external to system 10 or within system 10. Digital logic 14 ensures that data acquired from signal line 16A is substantially noise-free. Specifically, logic 14 filters signals on line 16A to provide clean signals to digital circuit 12 on signal line 16B. Logic 14 thus filters out undesirable noise pulses on signal line 16A so that these noise pulses are not input to digital circuitry 12, on signal line 16B. Logic 14 may for example filter out noise generated by asynchronous signals 18 coupled into line 16a from an unrelated device 20. This ensures that such noise pulses are not latched to affect processing within digital circuit 12

Figure 2:
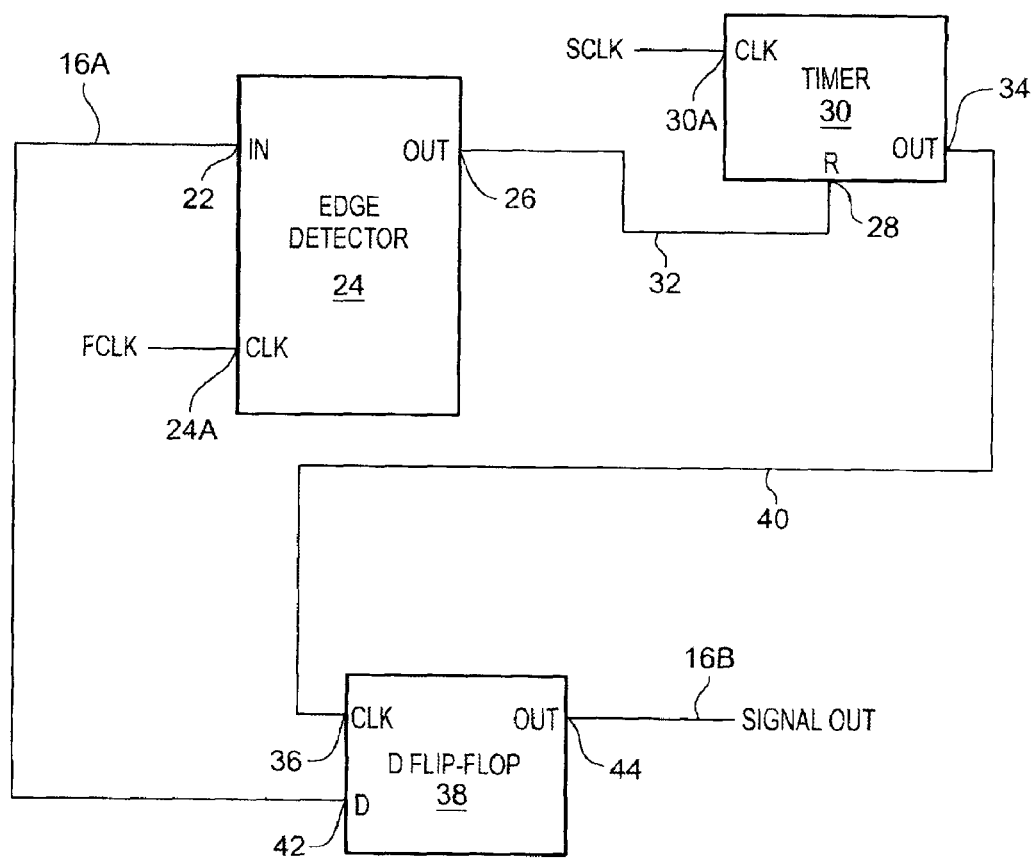
FIG. 2 illustrates logic, including edge detector logic, suitable for use as the filter of the system of FIG. 1.
Figure 3:
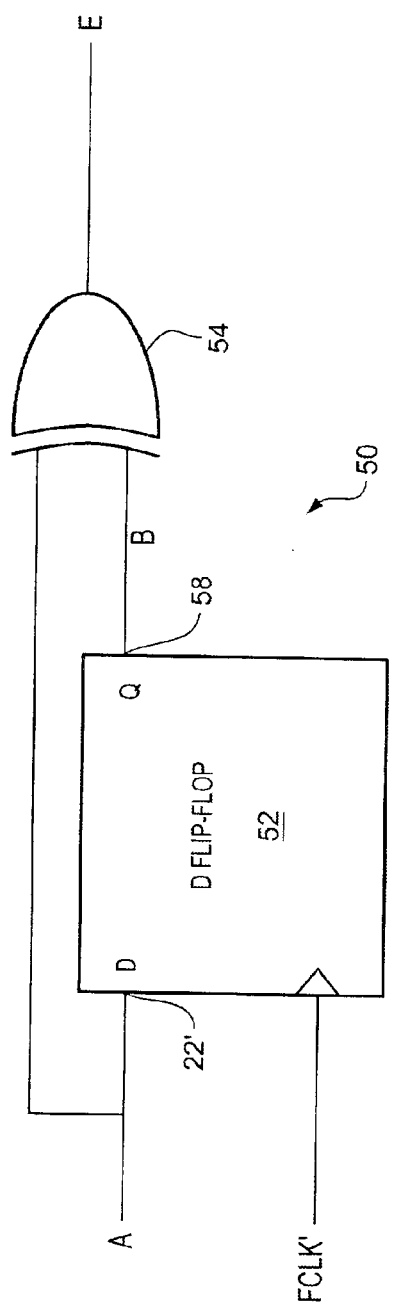
FIG. 3 illustrates one edge detector suitable for use as the edge detector of FIG. 2.

Digital filter logic 14 is further illustrated in FIG. 2. Signal line 16A couples to the input 22 of edge detector 24. One embodiment of edge detector 22 is shown in FIG. 3. Edge detector 22 has an output 26 coupled to the asynchronous reset 28 of a timer 30 via signal line 32. The output 34 of timer 30 couples to the clock input 36 of a D flip-flop 38 along signal line 40. Signal line 16A also couples to the D input 42 of flip-flop 38, as shown. The output 44 of flip-flop 38 couples to digital circuit 12, FIG. 1, as signal line 16B.

Edge detector 24 is clocked at clock input 24A with a fast clock signal "FCLK". FCLK may have a frequency of 8 MHz. Timer 30 is clocked at clock input 30A with a slow clock signal "SCLK". SCLK may have a clock period of 4.2 milliseconds. The frequency of FCLK is therefore much greater than the frequency of SCLK. With these clocking arrangements, timer 30 outputs a pulse on signal line 40 at the end of each sample period defined by SCLK. This pulse is then used to "latch" the input signal on line 32 (this input signal is also shown as signal E, FIG. 3). If noise occurs on input signal line 32 before timer 30 creates the pulse, then timer 30 resets and restarts the sample period defined by SCLK. Logic 14 thus ensures signals on line 16B are stable for sample time SCLK before it latches through to digital circuit 12, FIG. 1.

FIG. 3 shows schematic logic 50 suitable for implementing edge detector 24, FIG. 2. Logic 50 includes a D flip-flop 52 and an XOR gate 54. "A" corresponds to the signal value on signal line 16A, FIG. 2; A thus couples to the data input D 22' of flip-flop 52 (data input 22' may for example represent input 22, FIG. 2). XOR gate 54 compares D input 22' to the Q output 58 of flip-flop 52. "B" corresponds to the signal value from Q output 58. "E" corresponds to the digital difference comparison of A and B through XOR gate 54. Signal E is input to timer 30, FIG. 2, on signal line 32.

Figure 4:
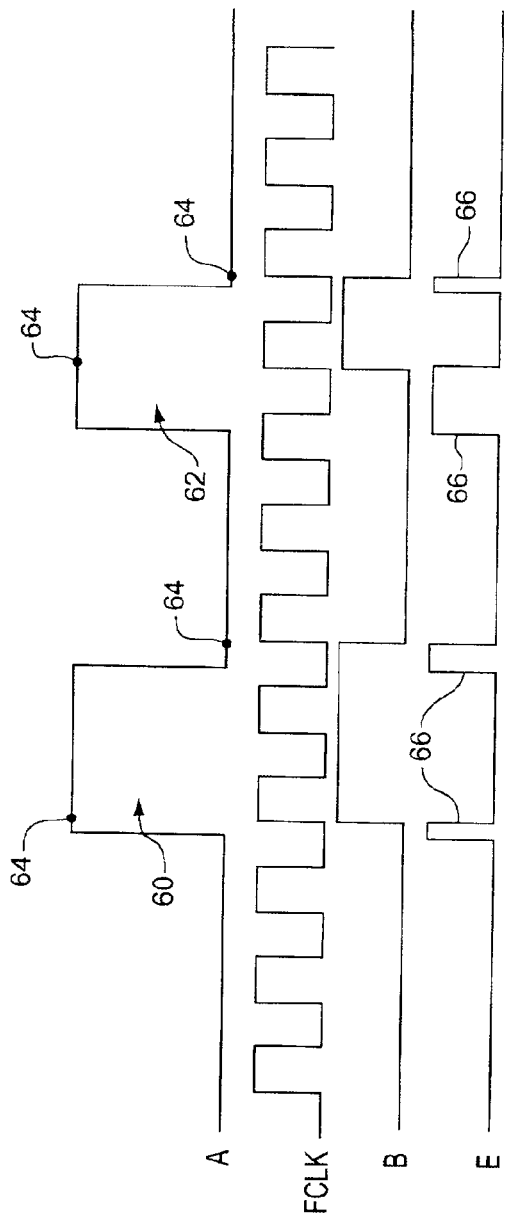
FIG. 4 illustrates typical timing diagram characteristics of the edge detector of FIG. 3.

FIG. 4 illustrates typical timing signals through logic 50, FIG. 3. Signal value A may have one or more noise spikes 60, 62 that are sampled at points 64 to set signal B; points 64 are determined at the rising edges of the FCLK signal. Signal E produced through XOR gate 54 thus has four pulses 66 corresponding to each change in signal A.

Figure 5:
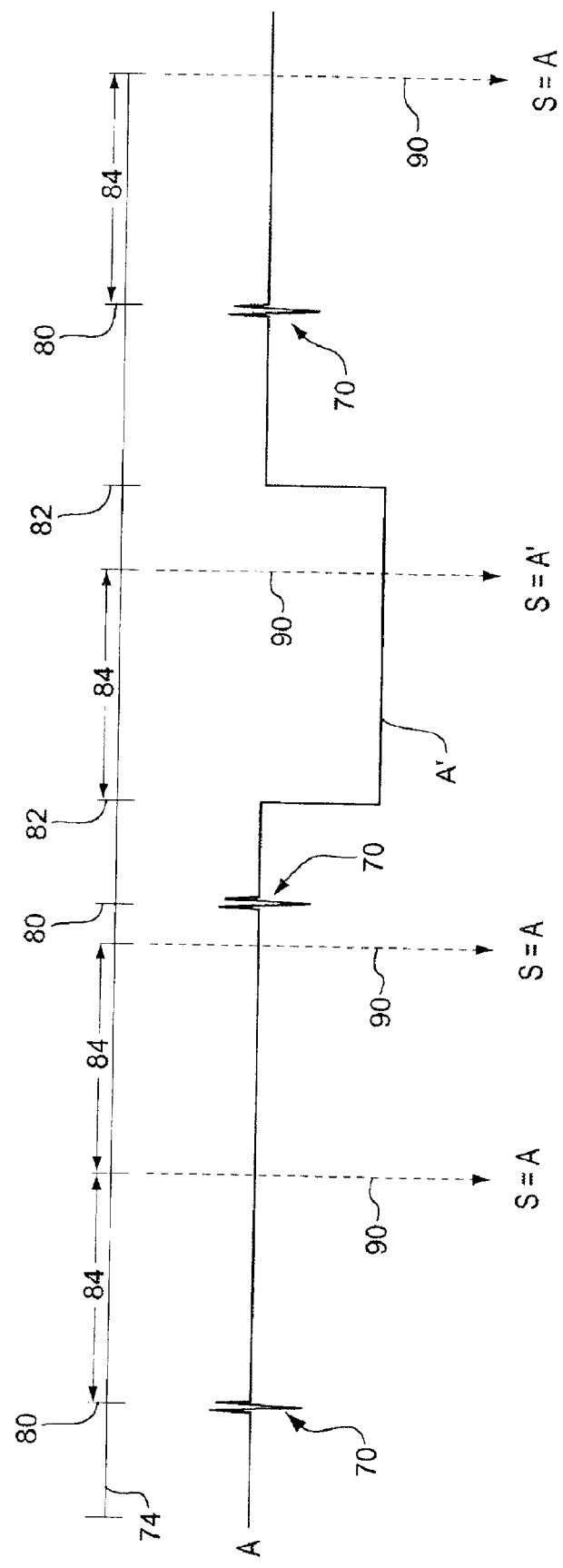
FIG. 5 illustrates representative sampling characteristics implementing the logic of FIG. 2 and FIG. 3 in the digital logic circuitry of FIG. 1.

FIG. 5 illustrates representative timing signals and signal values obtained through digital logic 14, FIG. 1. Signal line A again corresponds to input on signal line 16A, for filtering through digital logic 14. Values "S" correspond to the latched values of A (or A') sent to digital circuitry 12 on signal line 16B. A' corresponds to a non-noise change in signal A that is desired for input to circuitry 12. A also shows typical noise pulses 70 (e.g., similar to pulses 60, 62, FIG. 4) filtered out by logic 14. Timing through timer 30 is shown at 74. At each noise pulse 70, timer 30 is reset at time locations 80; each value S is therefore latched through to digital circuitry 12 only after a full timeout period 84 of timer 30. Desired signal change A' also resets timer 30 at time locations 82. Only after full timeout periods 84 of timer 30 is A (or A') latched through as value S, at points 90, to circuitry 12, as shown.

The following Verilog source code provides a non-limiting simulation of processor reset detect circuitry constructed according to the invention. Those skilled in the art should appreciate that other simulations, source code, hardware design and/or electronic detail, as a matter of design choice, can similarly provide processor reset detect circuitry without departing from the scope of the invention. Those skilled in the art should thus appreciate that the digital logic of FIG. 2 and FIG. 3 may be implemented as a single integrated circuit, stand-alone or embedded within other chips, to perform the functions herein and without departing from the scope of the invention.

```
***
//
// FileName      : timer.v
//                :
// Title          : Timer
//                :
// Purpose        : A general purpose timer
//                : When timer is enabled, it counts continuously,
//                : outputting a pulse every <divideby> CLK periods.
//                : Pulse duration is one clock period
//                :
// IncludeFiles   : none
//                :
// Conventions    : Active low signals are identified with '_l' or '_L'
module timer (
    CLK,
    RESET,
    QOUT);
parameter width = 3;      //number of flipflops required
parameter divideby = 6;   //length of pulse = divideby clock periods
input   CLK;
input   RESET;
output  QOUT;
reg QOUT;
reg [width-1:0] cnt;
always @(posedge CLK or posedge RESET)
begin
    //RESET
    if (RESET)
        begin
            cnt <= 0;
            QOUT <= 0;
        end
    //Hit <divideby> time
    else if (cnt == divideby)
        begin
            cnt <= 0;
            QOUT <= 1;
        end
    //Enabled and counting
    else
        begin
            cnt <= cnt + 1;
            QOUT <= 0;
        end
end
endmodule //timer
//
// FileName      : retrig_timer.v
//                :
// Title          : Digital retriggerable timer
//                :
// Purpose        : A general purpose retriggerable timer
//                : When module is enabled (not RESET), any change in
//                : the TRIG input will cause QOUT to stay low for
//                : a user-specified period of time.
//                : A slower clock (SCLK) is used for the timer
//                : A faster clock (FCLK) is used for detecting an edge
//                : Timeout is determined by SCLK frequency and
//                : divideby parameter.
//                :
// IncludeFiles   : timer.v
//                : Edge_Detect.v
//                :
// Conventions    : Active low signals are identified with '_l' or '_L'
//                :
module retrig_timer (
    SCLK,
    FCLK,
    TRIG,
    RESET,
    QOUT);
parameter width = 7;        //number of flipflops required
parameter divideby = 100;   //length of pulse = divideby clock periods
input   SCLK;
input   FCLK;
input   TRIG;
input   RESET;
output  QOUT;
```

```
                                -continued wire reset_timer;
//Detect change in TRIG
Edge_Detect Edge_Detect(
    .CLK (FCLK),
    .DIN (TRIG),
    .RESET(RESET),
    .QOUT (reset_timer));
//pulse timer
timer #(width,divideby) timer(
    .CLK    (SCLK),
    .RESET  (RESET | reset_timer),
    .QOUT   (QOUT));
endmodule//retrig_timer
//
// FileName       : Glitch_Filter.v
//                :
// Title          : Digital glitch filter
//                :
// Library        : WORK
//                :
// Purpose        : A general purpose glitch filter
//                : When module is enabled (not RESET), any change in
//                : the IN input will restart a timer. If the timer
//                : expires w/ no further changes in the IN input, then
//                : IN gets latched through to the output.
//                : This prevents glitches from passing
//                : The timeout is determined by the parameter divideby
//                : The number of flipflops used in the counter is
//                : determined by the parameter width.
//                : SCLK is used for timer length
//                : FCLK is used to detect changes in IN
//                :
// IncludeFiles   : retrig_timer.v
//                :
// Conventions    : Active low signals are identified with '_l' or '_L'
//                :
module Glitch_Filter (
    SCLK,
    FCLK,
    IN,
    RESET,
    QOUT);
parameter width = 7;        //number of flipflops required
parameter divideby = 100;   //length of pulse = divideby clock periods
input   SCLK;
input   FCLK;
input   IN;
input   RESET;
output  QOUT;
reg     QOUT;
wire    sel;
//implement retriggerable timer
retrig_timer #(width,divideby) timer(
    .SCLK (SCLK),
    .FCLK (FCLK),
    .TRIG (IN),
    .RESET(RESET),
    .QOUT (sel));
//implement selector
always @(posedge sel or posedge RESET)
begin
    //RESET, QOUT <= 0
    if (RESET)
        QOUT <=0;
    else
        QOUT <= IN;
end
endmodule//Glitch_Filter
//
// FileName       : Edge_Detect.v
//                :
// Title          : Edge Detector
//                :
// Library        : WORK
//                :
// Purpose        : This module detects any edge of an input and
//                : generates a pulse on the output one CLK wide.
//                : The pulse appears 2 clocks after the change in DIN
//
```

-continued

```
// IncludeFiles   : none
//                :
// Conventions    : Active low signals are identified with '_l' or '_L'
//                :
module Edge_Detect (
    RESET,              // in, asynchronous reset
    CLK,                // in, general purpose clock
    DIN,                // in, data input with edge we're looking for
    QOUT) ;             // out, rising edge pulse output
input RESET;
input DIN;
input CLK;
output QOUT;
        reg QOUT;
    reg re_q0;
    reg re_q1;
    reg reset0;
    req reset1;
    always @(posedge CLK or posedge RESET)
    begin
        if (RESET)
            begin
                re_q0 <= 0;
                    re_q1 <= 0;
                    reset0 <= 1;
                    reset1 <= 1;
                    QOUT <= 0;
            end
        else
            begin
                re_q0 <= DIN;
                re_q1 <= req0;
                    reset0 <= RESET;
                    reset1 <= reset0;
                    QOUT <= ((~re_q1 == re_q0) & !reset1 ? 1 : 0);
            end
    end
endmodule
***
```

© 2001 Hewlett-Packard Company

The invention thus attains the objects set forth above, among those apparent from the preceding description. Since certain changes may be made in the above methods and systems without departing from the scope of the invention, it is intended that all matter contained in the above description or shown in the accompanying drawing be interpreted as illustrative and not in a limiting sense. It is also to be understood that the following claims are to cover all generic and specific features of the invention described herein, and all statements of the scope of the invention which, as a matter of language, might be said to fall there between.

Having described the invention, what is claimed is:

1. A method of separating noise from a signal on a signal line to a digital circuit, comprising the steps of:
   determining one or more edges of the noise relative to a fast clock;
   resetting a timer according to the edges;
   clocking output from the timer relative to a slow clock, the slow clock being slower than the fast clock; and
   communicating a first value from the signal to the digital circuit after a period, defined by the slow clock, within which the timer has not reset.

2. The method of claim 1, wherein the step of resetting the timer comprises asynchronously resetting the timer.

3. The method of claim 1, wherein the step of determining the one or more edges comprises the steps of utilizing an edge detector having a first flip-flop and inputting the signal to an input of a first flip-flop.

4. The method of claim 3, further comprising the step of outputting a B signal value at an output of the first flip-flop.

5. The method of claim 4, wherein the step of outputting the B signal comprises latching the B signal value to a second value of the signal occurring at rising edges of the fast clock.

6. The method of claim 4, further comprising the step of digitally comparing the B signal value to the signal.

7. The method of claim 6, wherein the step of digitally comparing comprises the step of utilizing an XOR gate.

8. The method of claim 7, further comprising the step of communicating an output of the XOR gate to the timer.

9. The method of claim 1, wherein the step of communicating comprises the step of clocking a second flip-flop from an output of the timer.

10. The method of claim 9, further comprising the step of inputting the signal to the second flip-flop.

11. The method of claim 9, wherein the step of communicating comprises the step of outputting a value of the signal through the second flip flop and to the digital circuit, when clocked by the timer.

12. The method of claim 1, wherein the step of determining one or more edges of the noise relative to a fast clock comprises determining the one or more edges at a fast clock rate of at least about one megahertz.

13. The method of claim 12, wherein the step of clocking output of the timer comprises clocking output of the timer at a clock rate that is at least about a factor of 1000 slower than the fast clock rate.

14. Logic apparatus for filtering noise from a signal on a signal line to a digital circuit, comprising:
    an edge detector for detecting edges of the noise and relative to a fast clock; and a timer for clocking a latch to a value of the signal line and relative to a slow clock, the slow clock being slower than the fast clock, the timer being reset by one or more signals from the edge detector and corresponding to the edges, the latch occurring after a time period defined by the slow clock within which the timer has not reset.

15. Apparatus of claim 14, the timer being asynchronously reset by the signals from the edge detector.

16. Apparatus of claim 15, further comprising a first flip flop connected to the timer and the signal line, the first flip flop latching the value of the signal when clocked by the timer.

17. Apparatus of claim 16, wherein the first flip flop comprises a D flip flop, the signal line being coupled a D input to the D flip flop.

18. Apparatus of claim 14, wherein the edge detector comprises a second flip flop and a digital comparator, the signal line being coupled to an input to the second flip flop, the second flip flop being clocked by the fast clock to produce a B signal value at an output of the second flip flop, the B signal corresponding to a value of the signal line at a rising edge of the fast clock, the digital comparator comparing the value of the signal to the B signal value for input to the timer.

19. Apparatus of claim 18, wherein the second flip-flop comprises a D flip-flop, and wherein the digital comparator comprises an XOR gate.

* * * * *